United States Patent [19]

Noble et al.

[11] 4,223,354
[45] Sep. 16, 1980

[54] PHASE CORRECTED RASTER SCANNED LIGHT MODULATOR AND A VARIABLE FREQUENCY OSCILLATOR FOR EFFECTING PHASE CORRECTION

[75] Inventors: Milton L. Noble, Liverpool; Samuel E. Craig, Manlius; William G. Hoefer, Syracuse, all of N.Y.

[73] Assignee: General Electric Company, Syracuse, N.Y.

[21] Appl. No.: 938,150

[22] Filed: Aug. 30, 1978

[51] Int. Cl.$^2$ .................. H04N 5/66; H04N 5/74
[52] U.S. Cl. .................. 358/233; 356/305; 356/308; 356/328
[58] Field of Search .................. 358/62, 231, 233; 356/303, 305, 308, 328

[56] References Cited

U.S. PATENT DOCUMENTS 3,818,197  6/1974  Piccolo et al. .................. 356/328 X

*Primary Examiner*—Robert L. Richardson
*Attorney, Agent, or Firm*—Richard V. Lang; Carl W. Baker

[57] ABSTRACT

The present invention relates to a phase corrected raster scanned light modulator in which information modulated on a carrier is used to form a grating whose spatial frequency along the scanning line varies in accordance with the signal modulation frequency. Thickness variation in the medium on which the grating is formed causes an undesired phase modulation of the light which may be corrected by altering the carrier frequency. A novel oscillator is described which may be stepped discontinuously in frequency while the waveform and its slope remain continuous, which is of sufficient accuracy and agility to provide a real time region by region phase correction of the raster in the light modulator. The variable frequency oscillator is of high stability and can step from one value to another for intervals as short as one microsecond.

9 Claims, 10 Drawing Figures

PRACTICAL CROSS SECTION

IDEALIZED CROSS SECTION

ACTUAL CARRIER VARIATION

PHASE CORRECTED RASTER SCANNED LIGHT MODULATOR AND A VARIABLE FREQUENCY OSCILLATOR FOR EFFECTING PHASE CORRECTION

BACKGROUND OF THE INVENTION

1. Field of the Invention

The invention relates to raster scanned light modulation utilizing a coherent light source and producing a phase modulation of the light. More particularly, the invention relates to input optical transducers, such as a coherent light valve, in which surface deformations of the recording medium form a variable pitch grating for phase modulation of the light and in which phase error due to undesired thickness variation of the medium may occur and require correction. The invention also relates to a means for generating a variable frequency wave suitable for phase correction to the optical modulation system.

2. Description of the Prior Art

In raster scanned light modulators in which coherent light is phase modulated, the ultimate accuracy of the system can only be achieved if system tolerances are held to a fraction of a wavelength of light. In the event of thickness variation in the light modulating medium, the phase front may be retarded or advanced at different portions of the raster and in consequence, substantial error may be introduced into the system. When a light modulator is used in such applications as a spectrum analyzer in which a Fourier transformation occurs, terms which should be located at specified coordinates in the spatial frequency plane of the transforming lens may be blurred and of reduced output so that accurate interpretation is prevented.

SUMMARY OF THE INVENTION

It is an object of the present invention to provide an improved raster scanned light modulator.

It is another object of the present invention to provide an improved raster scanned coherent light modulator in which regional phase errors over the raster are corrected.

It is further object of the present invention to provide an improved raster scanned coherent light modulator in which a carrier wave is modulated by an input signal to form variable pitch gratings along the scan lines, and in which regional phase errors of the raster are corrected by alteration of the frequency of the carrier wave.

It is another object of the present invention to provide an improved variable frequency oscillator.

It is still another object of the present invention to providea novel variable frequency oscillator in which both phase and frequency are subject to control.

It is another object of the present invention to provide a novel variable frequency oscillator in which the output frequency may be stepped from one value to another value while the output waveform remains continuous.

It is a further object of the present invention to provide a novel variable frequency oscillator in which the output frequency may be stepped from one value to another value while the output waveform and the slope of the output waveform remains continuous.

It is another object of the present invention to provide a novel variable frequency oscillator in which the output frequency may be stepped from one value to another value in a short interval, and with high accuracy in frequency.

It is an additional object of the present invention to provide an improved variable frequency oscillator for phase correction of a raster scanned coherent light modulator.

It is a further object of the present invention to provide an improved optical spectrum analyzer employing a coherent light valve wherein phase correction is achieved for inherent subdivisions of the raster by a novel variable frequency oscillator whose frequency is stepped at the rate that the individual subdivisions are scanned.

These and other objects of the invention are achieved in a raster scanned light modulator in which information modulated on a carrier is used to form a grating whose spatial frequency along the scanning line varies in accordance with the signal modulation frequency, and whose spatial frequency from line to line is constant, said light modulator being subject to phase errors which vary smoothly over the raster, and which permit partitioning said raster into a plurality of rectangular subdivisions, each associated with a predetermined phase error. Phase correction is achieved by a combination comprising a programmable variable frequency oscillator for generating said carrier, said oscillator having an output waveform which is continuous and without discontinuous change in slope as the frequency is stepped through successive discontinuous values; a first memory means for storing a quantity for each raster subdivision, corresponding to the carrier frequency required for phase correction of each subdivision, and means synchronized with horizontal and vertical scanning of said optical input transducer and coupled to said first memory means and to said programmable variable frequency oscillator for generating an output waveform having successive instantaneous frequencies of values corresponding to those stored in said first memory means for each subdivision as a scan line crosses it, said waveform maintaining continuity until the scan line is complete, and repeating the process through successive scan lines until scanning of the raster is complete.

In accordance with a second aspect of the invention, a second memory means is provided for storing a number corresponding to a desired starting phase angle $\theta_e$ for the carrier timed with the beginning of each scan line, one starting phase angle $\theta$ being stored for each initial subdivision, aligned along the edge of the raster from which horizontal scanning starts. The output waveform of the oscillator at the start of each scan line starts at a phase corresponding to that stored in said second memory means for the initial subdivision in which the scan line starts.

The novel variable frequency oscillator employed for phase correction comprises a clocked digital adder having a first and a second input and an output, first memory means for applying an input quantity to said first adder for recurrent addition at the clocking interval, the input quantity being proportional to the desired instantaneous output frequency f(o) and denoting an instantaneous phase angle increment $\Delta\theta$; a clock controlled digital register transferring input to output at each clocking interval, the clocking rate f(c) being at least four times greater than the maximum oscillator output frequency; the adder output being coupled to the register input, the register output being coupled to the second adder input to complete the recirculation loop. The accumulated count in the register output designates a succession of discrete phase angles incremented at the clocking rate, and counting repetitively to a full count of $2^m$ counts, with any remainder exceeding the $2^{mth}$ count being preserved in the next count to maintain equality in angular incrementation. A digital read only memory is provided coupled to the output of the register and producing output values which are a sine (or cosine) function of the discrete input angles in angular increments which are multiples of $2\pi(\frac{1}{2})^m$ radians, $2^m$ input counts corresponding to $2\pi$ radians, and m being selected to be large enough to provide the desired frequency resolution.

The variable frequency oscillator also includes a first digital to analog converter coupled to the output of the read only memory for converting the discrete digital values into discrete analog sine (or cosine) values, and a low pass filter coupled to the output of the first digital to analog converter having a high frequency cut off adjusted to synthesize a sustained waveform from the discrete analog values at an output frequency f(o):

$$f(c) = \frac{\Delta\theta}{2\pi} f(c)$$

where $\Delta\theta$ is the phase angle increment measured in radians and f(o) is the clocking rate, said sustained output waveform assuming successive sine (or cosine) values.

In accordance with a further asspect of the invention, the oscillator is started at an arbitrary phase angle $\theta_e$ at the beginning of each scan line, for which second memory means are provided.

Preferably, the raster is partitioned into a plurality of regular rectangular subdivisions, each associated with a predetermined correction frequency stored in the first memory means, each of the initial subdividions at the edge of the raster where scanning starts being associated with a predetermined starting phase angle for said output waveform, the starting phase angle values being stored in the second memory means.

In a practical embodiment, the variable frequency oscillarot includes a read only memory which produces both sine and cosine functions of each register output. One function is coupled to the first digital to analog converter and the other function is coupled to a second digital to analog converter. A second low pass filter is provided coupled to the output of the second digital to analog converter. The two wave forms are then used to frequency modulate a fixed frequency oscillator. The modulation network includes a 90 degree phase shift network coupled to the fixed frequency oscillator; a first balanced mixer to which one waveform is coupled for modulating said fixed frequency oscillator at reference phase to produce a first pair of side bands about said fixed frequency; a second balanced mixer to which the other waveform is coupled for modulating the fixed frequency oscillator output at quadrature phase to produce a second pair of side bands about said fixed frequency, and an additive network for combining the mixer outputs for selection of one side band from said modulator outputs to produce a single, variable frequency output for use as the phase correcting carrier.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

DESCRITION OF PREFERRED EMBODIMENTS

Figure 1:
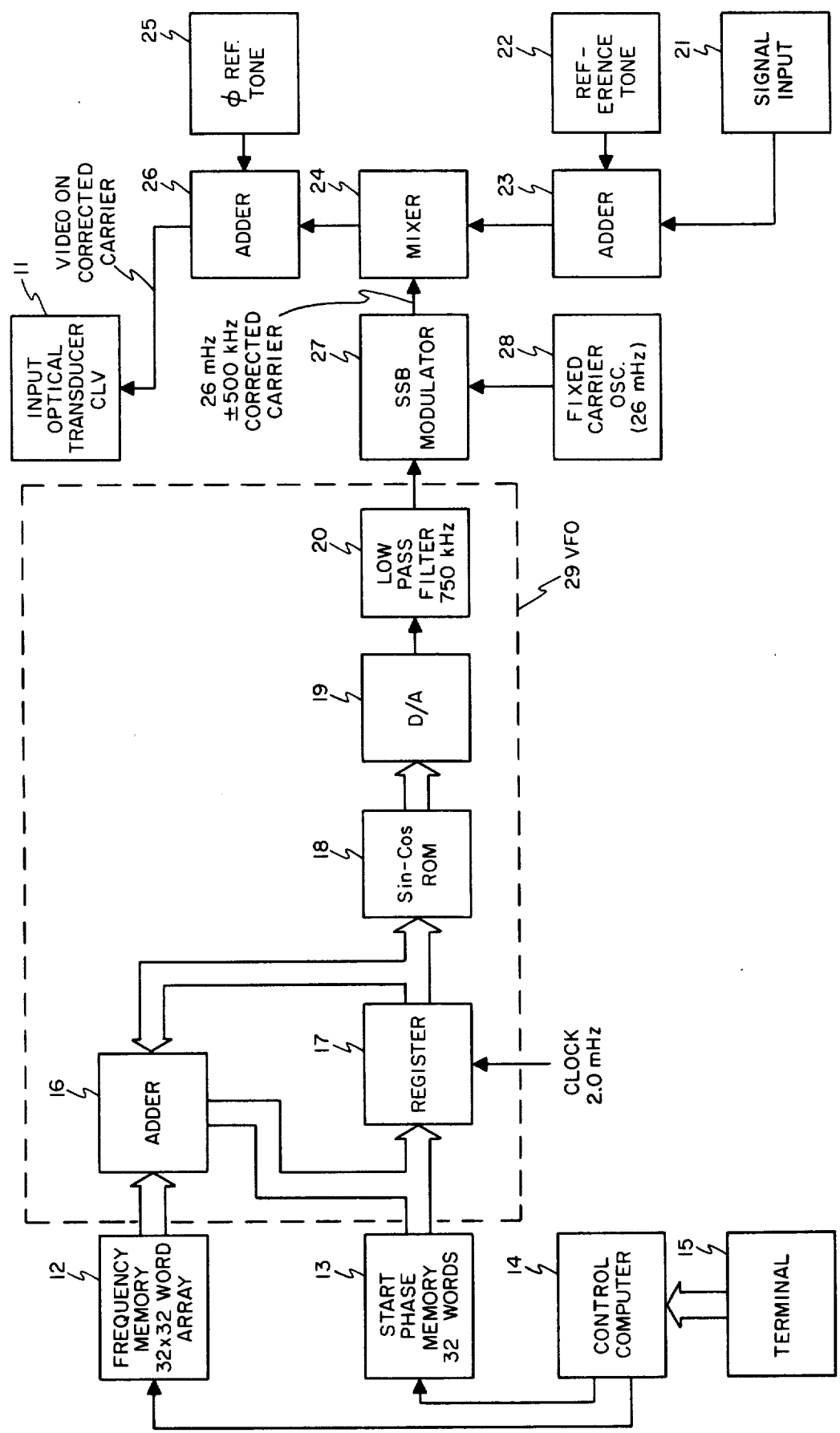
FIG. 1 is a simplified block diagram of the electrical elements cooperating to achieve phase correction of a raster scanned input transducer in an optical spectrum analyzer.

Referring to FIG. 1, a simplified block diagram of certain of the electrical elements cooperating to achieve phase correction of a raster scanned optical spectrum analyzer are shown. The illustrated elements include the input optical transducer 11 to which the phase corrections are applied, memories 12 and 13 which store individual correction signals for subdivisions of the raster under the control of control computer 14, itself subject to automatic control (not by means illustrated) or operator control via the terminal 15. The phase correction elements illustrated in FIG. 1 also include a novel variable frequency oscillator (16–20) generating a variable frequency wave of perscribed phase and frequency which is used for phase correction, the reference signals injection circuitry (22,23,25, 26) which includes means (25, 26) for generating a phase reference signal useful in sensing the phase error; and the modulation circuitry (21, 24, 27, 28) by means of which the input signal is modulated upon a carrier wave whose frequency and phase are modified for phase error correction. The visual and electrical means for sensing the phase error, made sensible by the phase reference signal, are not included in FIG. 1. These error sensing means aid in generating the phase correction inputs used either for automatic or manual control of the control computer 14 and which are stored in memories 12 and 13.

Of these last three principal means, the novel variable frequency oscillator in the simplified showing of FIG. 1 includes an adder 16, a register 17, a sin-cos ROM 18, a D/A converter 19, and a low pass filter 20. The modulation and reference circuitry include the signal input circuit 21, a source 22 of reference tones for transducer scanning adjustment, an adder 23 by means of which the two are combined and injected in a mixer 24, in which the video input and the reference tone are modulated upon a corrected carrier, a source 25 of a phase reference tone, which is coherent with the phase carrier, an adder 26 by means of which the phase reference tone is injected (at base bend) and the combination applied to the video input of the input optical transducer 11. The elements of the modulation circuitry are the single side band modulator 27 in which the variable frequency oscillator output is combined with a fixed frequency (26 MHz) carrier from the fixed carrier oscillator 28 to provide a variable frequency carrier for the mixer 24. Variation in the carrier frequency as a function of the sensed phase error is the means by which phase correction is achieved in the input optical transducer.

The input optical transducer 11 of the optical spectrum analyzer in the illustrated embodiment is a coherent light valve which requires phase correction for ultimate accuracy. The light valve is scanned in a conventional raster format with a fast horizontal sweep and a slow vertical sweep as in a conventional CRT display. The light valve is a device in which the scanned electron beam impinges on a thin film of oil, depositing electrical charges whose fields effect a thickness modulation of the oil film and a consequent phase modulation of the light. In a conventional light valve, the resltant thickness modulation is used in Schlieren projection system to produce intensity modulations in light either transmitted through or reflected off the surface of the oil film. In the coherent light valve herein described, coherent light is transmitted through the oil film to obtain a two dimensional optical output which varies in amplitude as a result of optical diffraction and interference effects. Input information is supplied to the light valve on a carrier wave, for example 26 MHz, and the input information, typically 10 to 20 MHz in bandwidth, is amplitude modulated upon this carrier. The carrier is suppressed to reduce spurious light in the output. The sidebands lie between 16 and 36 MHz. The modulated signal creates a physical deformation grating on each scan line of the oil film at a spatial frequency corresponding to the signal frequency, or more exactly, varying from point to point with the sidebands resulting from the modulation process. In short, a grating is formed on the oil film whose spatial frequency varies from point to point as a function of the input modulation. The output of the coherent light valve in an optical spectrum analyzer is an optical Fourier transformation of the video information, applied in the form of a time variant electric wave. The output having predetermined frequency terms, is displayed in the frequency plane of the transform optics. In the frequency plane, the optical system normally selects one of a number of redundant solutions. In each solution each spatial position is identified with one predetermined grating frequency and only one. The optical spectrum analyzer permits rapid and accurate visual identification of the signal present in the portion of the signal spectrum being examined.

In the frequency plane, the individual terms are displayed in a locus line set resembling a raster and giving a coarse and a fine measure of the frequency. The intervals between horizontal scan lines of the raster are maintained at a constant interval. The input information is modulated on a carrier along the scan lines of the raster, at a relatively fine interval. In consequence, the locus of successive frequency positions takes the form of a series of closely spaced parallel lines. The line to line spacing of the locus lines corresponds to a coarse measure of the frequency of the input wave and the position of a spectral term along an individual locus line corresponds to a fine measure of the frequency of the input wave. The locus lines are oriented orthogonal to the original lines of the oil film raster in respect to the optical axis of the system. In a given "solution", each point on the locus represents a discrete frequency term. Should a given frequency term be subject to a small frequency perturbation, the perturbed frequency term would appear slightly above or slightly below the proper term on the same locus line. If larger frequency perturbations occur, the term may appear in adjacent or more remote locus lines. If significant phase error is present over the face of the raster, a frequency term may be displaced or blurred over several locus lines, and it may be impossible to determine which is the correct locus line. In the phase error is small, any blurring may be reduced below the level that would create line to line ambiguity. In general, the effect of the difference in frequency scale between the two orthogonal axes in the frequency plane permits one to achieve a relatively high degree of accuracy in determining the frequencies of individual terms.

If the input transducer or other elements of the optical system in association with the input transducer introduce phase errors as suggested above, the phase errors cause aberration and displacements of the frequency terms plane and error is introduced into the spectrum analyzer output. Since all regions of the raster may contribute to the light impinging at any particular coordinate in the frequency plane, a variation in phase error from region to region over the surface of the raster will create a cluster of overlapping aberrated spots rather than a single distinct value. It has been proposed to vary the carrier frequency before it is applied to the modulator to correct the effect of regional phase errors over the light valve raster. If the carrier frequency is varied in any given area of the raster, individual frequency terms generated in the modulation will be offset from reference positions by an amount which is a function of the variation. If the carrier frequency is varied in any given area of the raster in a sense and magnitude to compensate for the phase errors in the coherent light valve, then in principle, each frequency term may be re-positioned at the appropriate position along the locus in the frequency plane and the effect of phase errors may be removed.

The practical apparatus for phase correction herein described takes into account the fact that the phase error of the light valve varies smoothly over the raster and does not change rapidly with time. In accordance with the invention, the raster of the coherent light valve is examined by means more particularly shown in FIG. 3, while a phase reference tone is supplied to a coherent light valve. During this process a measurement of the phase error is obtained in a relatively large number of small sample regions of the raster. These sample regions, typically 1/1024th of a raster, are each associated with a correction factor. This correction is stored in the memory system where it may be retrieved on a real time basis to effect dynamic correction of the optical output of the spectrum analyzer. The apparatus illustrated in FIG. 1 accepts the information which is stored in the memory blocks 12 and 13 by means that will be described and synthesizes a variable frequency carrier in a suitable form for achieving phase compensated operation of the light valve.

Figure 2:
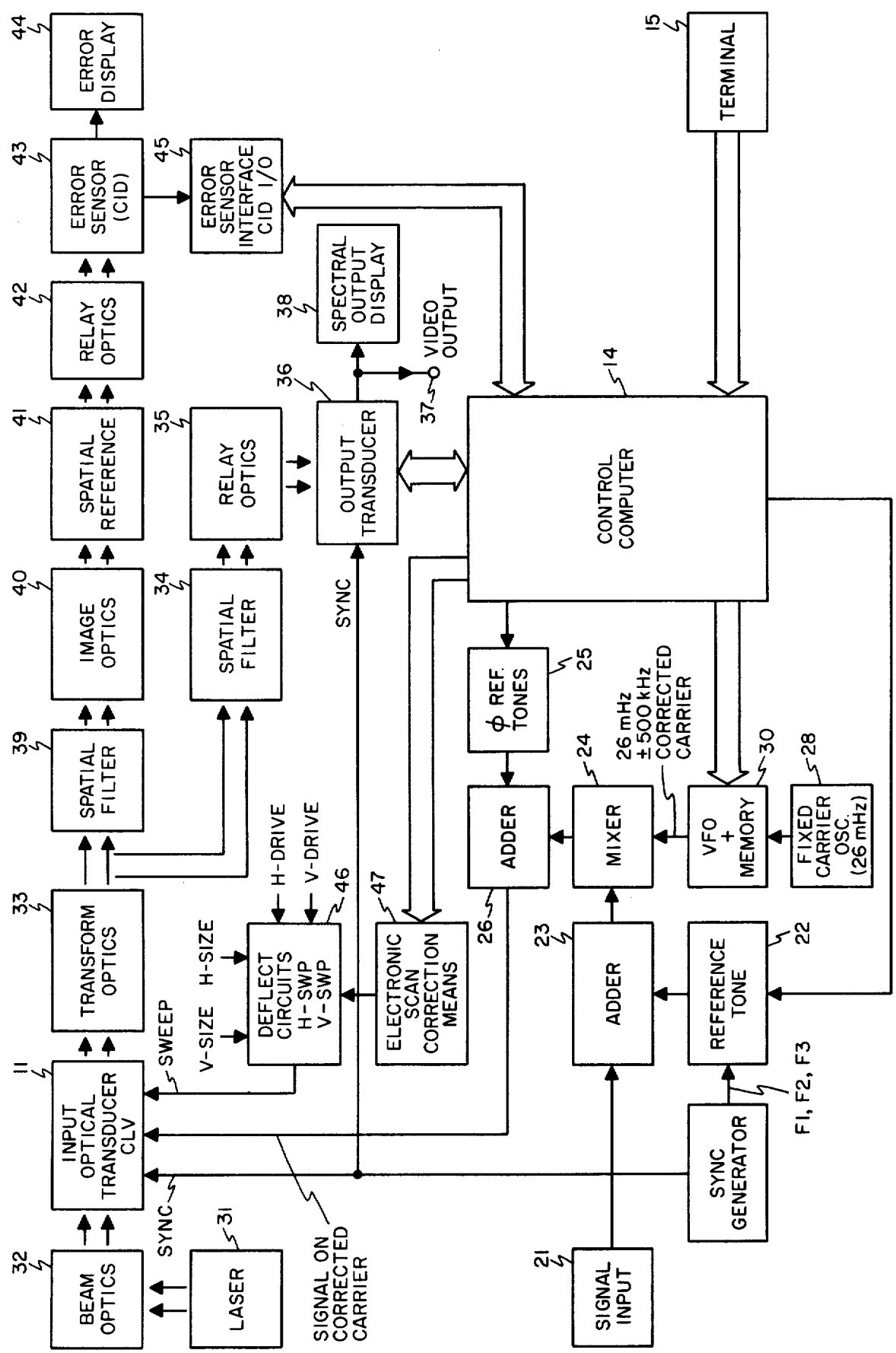
FIG. 2 is a digram of the electrical and optical blocks of an optical spectrum analyzer including the phase correction system and the phase error sensing system.

A phase-corrected optical spectrum analyzer using a coherent light valve as the input optical transducer is illustrated in FIG. 2. In FIG. 2, the blocks illustrated in FIG. 1 have been generally repeated using the same reference numerals except for one consolidated block, and additional connections have been provided to other elements of the optical spectrum analyzer consistent with the operational description. In FIG. 2, the signal input 21, the adder 23, the mixer 24, and the adder 26 which are sequentially connected to the video input of the input optical transducer 11 are repeated as before. The source 22 of the scanning reference tones and the source 25 of the phase reference tones are illustrated with control connections to the control computer 14. The variable frequency oscillator 29, shown to comprise the elements 16 through 20 in FIG. 1, is combined in a single block in FIG. 2 bearing a reference numeral 30, which also includes a frequency memory 12 and the starting phase memory 13 of FIG. 1, implying that the elements are associated together.

In addition to the foregoing, FIG. 2 illustrates the elements in the optical paths through the imput optical transducer or "light valve" 11. A laser 31 is shown directing a beam into the beam optics 32 which collimates the beam so as to present a coherent wave front of adequate cross section to illuminate the raster of the light valve. In passing through the raster of the light valve, the phase of the beam is modulated by the thickness deformations effected in the oil film by the video signal. The light modulated by passage through the light valve is then sent through the transforming optics 33, in the frequency plane of which a first (34) and a second (39) spatial filter are provided. A beam splitter, not specifically illustrated in FIG. 2, divides the beam into two paths for parallel application to each filter. The spatial filter 34, to which one portion of the beam is applied, selects a complete solution passing all terms lying within that solution. The selected solution is transferred through relay optics 34 to an output transducer 36, which may take the form of a solid state imager with electronic readout or a vidicon camera. The output transducer produces a time variant electrical signal of the image formed on its input, and the time variant output may be supplied either to an electrical output terminal 37 for additional processing in its electrical form or to the spectral output display 38 where it may be examined visually. Assuming that the input signal contains a variety of electrical signals over the frequency band accepted by the optical spectrum analyzer, the spectral output will contain a number of points of light whose brightness is a function of the intensity of the individual frequency terms in the input waveform and whose vertical and horizontal positions on the raster output transducer represent fine and coarse measures of the frequency of these terms. Optionally, the spectral output may be isometrically displayed so that the brightness of individual terms appears as the height of sharply rising peaks, distributed over an isometrically displayed frequency plane.

The second part of the beam transformed by the optics 33 is applied via a beam splitter to the spatial filter 39 used for scan correction and for phase correction. The scan correction is not a part of the present invention, but is a typical requirement in systems of the accuracy herein contemplated. The spatial filter consists of a set of four small holes disposed at appropriate coordinates in the frequency plane of the optics 33 to accept the scan reference and phase reference tones. One of these four holes disposed at the coordinate selected for the phase reference tone is made sufficiently small to form a diffraction limited phase reference. The light, spatially filtered by filter 39, is then passed through imaging optics 40 and applied to a spatial reference grating 41 disposed in the image plane. The grating 41, as will be explained in greater detail below, has periodic openings arranged along a first dimension at one interval for selection of one frequency and periodic openings in an orthogonal direction at a second interval for acceptance of another frequency. The frequencies selected correspond to the horizontal and vertical pilot tone frequencies. With one hole made small enough for phase reference accuracy, the arrangement may be used for both vertical scan and phase correction. The output of the spatial reference 41 is then applied via the relay optics 42 to an error sensing solid state imager 43. The output of the solid state imager 43 is coupled to a suitable CRT display 44. In the scan correction or phase correction mode the error display provides a Moire pattern which is a visual indication of the degree to which scan correction or phase correction has occurred. The error display, in the ideal condition, shows an all white field. In the non-ideal case, which is typical, a Moire pattern having some 4 or more interference fringes occurs before correction. After correction, the Moire fringes may be reduced to 1 or less. The solid state imager 43 provides electrical output via the error sensor interface 45 to the control computer 14. The error sensor interface 45 is typically electrical circuitry providing electronic readout of the error sensor and couples an electrical signal corresponding to that readout to the control computer. In the scan correction role, the control computer provides correction signals which are superimposed upon the vertical and the horizontal drive supplied via the electronic scan correction means 47 to the deflection circuits 46.

Figure 3:
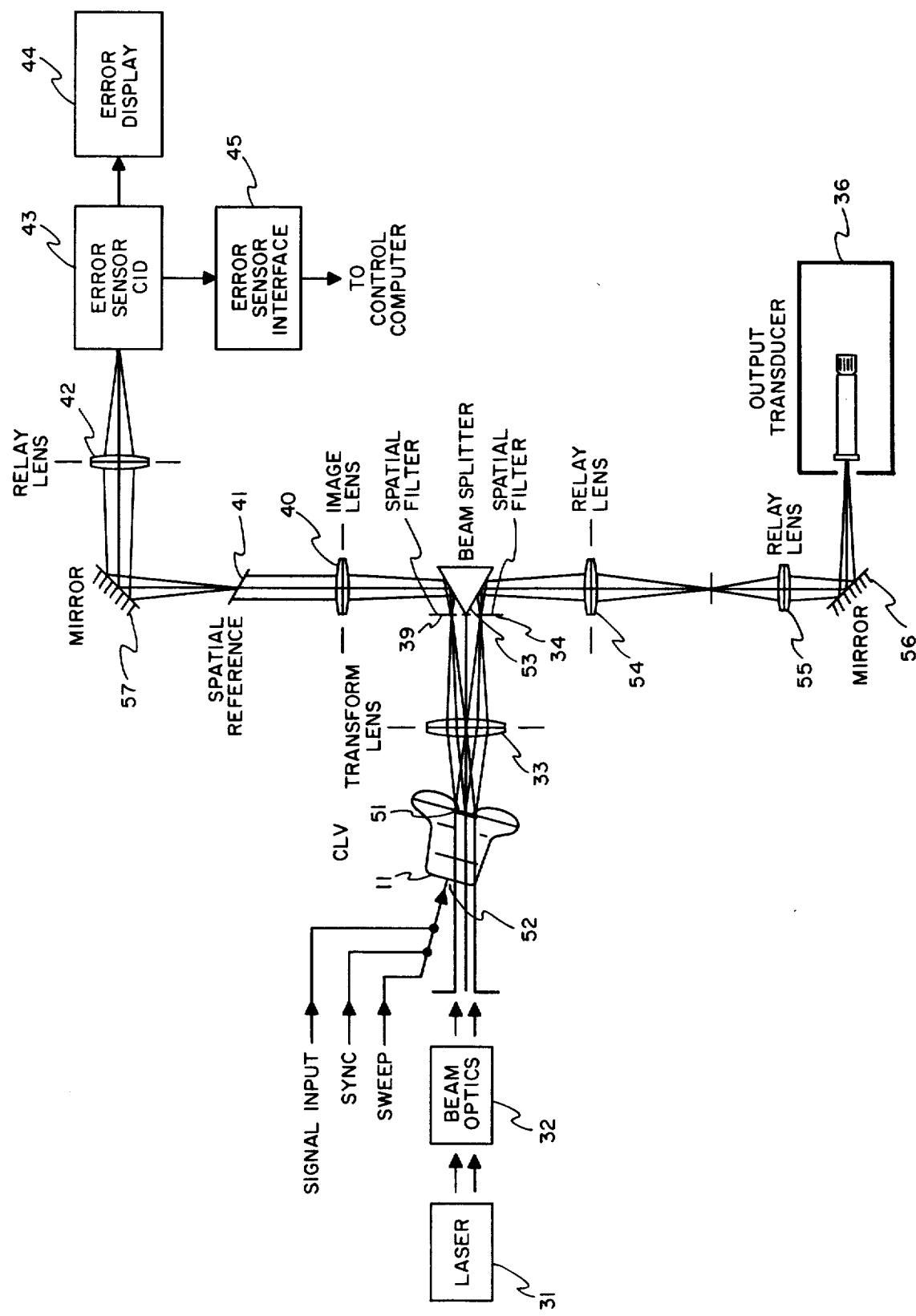
FIG. 3 is a diagram of the principal optical blocks of an optical spectrum analyzer including the elements which sense the phase error.

In FIG. 3, the optical elements of FIG. 2 are repeated in a drawing which is a highly simplified optical schematic of the optical spectrum analyzer showing the means for phase error sensing. As in FIG. 2, the laser 31 and beam optics 32 are illustrated directing a coherent beam of light into the coherent light valve 11. The beam impinges upon the raster 51 within the coherent light valve. The raster 51 is formed by a signal response pattern of electric charges laid down by a finely focused electron beam from the gun 52 to form a grating on a film of oil within the light valve. The electron gun 52 includes a cathode, signal grid, focusing an accelerating means not separately illustrated. Deflection means for scanning the electron beam are also provided and are not illustrated. Passage of the laser beam through the raster causes a phase modulation of the light in accordance with the input signal applied to the electron gun. The phase modulated light beam is next passed through a processing lens 33 for Fourier transformation. The transformed output impinges on the spatial filters 34 and 39, placed in the frequency plane of the processing lens 33. The spatially filtered light then impinges on a beam splitter 53. The beam splitter 53, which is illustrated in a plan view, is a pair of mirror surfaces formed on a prism whose edge is aligned so as to intersect the axis of the laser beam and reflect the impinging portions of the transformed beam into two new paths oriented at 90 degrees to the initial axis. The positive and negative diffraction orders formed by the grating are spaced along a straight line perpendicular to the optical axis of the system and perpendicular to the lines of the original grating which creates the diffraction effects. With the prism edge intersecting the zero order it should next be aligned so that the prism edge is orthogonal to the line through the diffraction orders or parallel to the grating lines. With the prism so aligned, one mirror surface (the lower surface in FIG. 3) intercepts the Fourier transformation solution in the frequency plane lying between the zero order and the negative first order coordinates. That mirror surface accepts a portion of the Fourier solution transmitted through the spatial filter 34. The filter 34 has a clear aperture dimensioned to pass that solution, the reject any additional redundant solutions that may be present in the frequency plane. The spatially filtered light is then passed through the relay optics consisting of two lenses 54, 55 and a mirror 56 to the output transducer 36 for the purpose earlier mentioned. The upper mirror surface of the beam splitter (as seen in FIG. 3) accepts a portion of the Fourier solution transmitted through the spatial filter 39. The spatial filter 39 is disposed in the frequency plane lying between the zero order and the positive first order coordinates. The spatial filter 39 has four holes positioned for selecting the tones required for vertical and horizontal scan correction and for phase correction. The spatially filtered light reflected by the mirror surface is applied via the image lens 40 to the spatial reference 41. The relay optics consisting of the mirror 57 and the relay lens 42, couples the light derived through the spatial reference 41 to the error sensor CID 43 where it is displayed on the error display 44.

Figure 4:
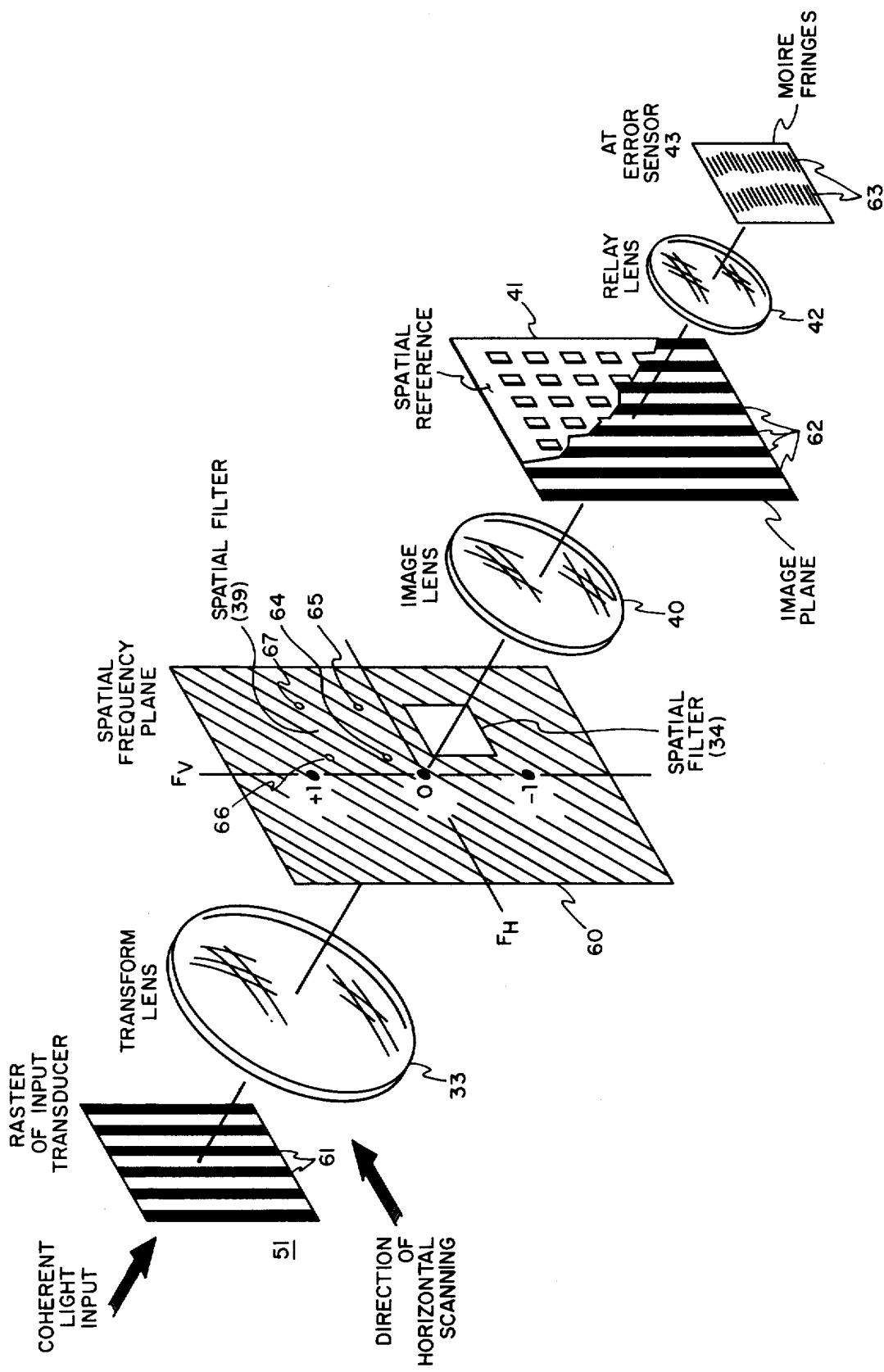
FIG. 4 is a simplified perspective view of the optical elements of the optical spectrum analyzer used to sense phase error.

The optical elements used in phase error sensing are illustrated in perspective in FIG. 4 oriented with respect to an idealized, unfolded and unbranched optical axis. The figure includes in order from left to right the raster 51, the transformation lens 28, the spatial filters 34, 39, the image lens 40, the spatial reference 41, a relay lens 42 and the Moire fringes formed at the input plane of the error sensor 43. The figure omits the optical output branch, which follows the spatial filter while showing the optical branch following the spatial filter 39 involved in phase error sensing.

As illustrated in FIG. 4, a grating 61 has been written upon the raster in the coherent light valve and it is orthogonal to the horizontal scan lines. This pattern may have been produced by one of the reference tones provided by the reference sources 22 or 25. For phase correction, a tone would be provided by the source 25. The grating 61 effects a phase modulation of the laser light beam, and the phase modulated beam is transformed by the transform lens 33 into its Fourier components in the spatial frequency plane 60. The clear spatial filter 34, which consists of rectangular opening, and the tone selection filters 39, which consists of four small holes, are disposed in the spatial frequency plane 60. The light passing through the clear aperture 34 is diverted to the output transducer 36 by the beam splitter (not illustrated in FIG. 4) and is not used subsequently in the FIG. 4 illustration. The light derived from the tone selection filter 39, which contains four holes (64–67), is collected by the image lens 40 in whose image plane an interference pattern 62 is produced by one hole pair (64, 65), as illustrated. These two holes are on a line parallel to the horizontal axis, and are spaced in correspondence to the tone to be selected, creating the vertically oriented strips of the interference pattern 62 illustrated. The bidirectional spatial reference 41, previously described, is also disposed in the image plane. The spatial reference 41 has regularly spaced openings in both horizontal and vertical orientations. The horizontal interval establishes a spatial frequency equal to that of the desired tone established between 64 and 65. The image lens 40 images the light passed through the spatial filter 34 upon the spatial reference 41 disposed in its image plane. Those portions of the image that impinge on holes in the spatial reference are imaged by the relay lens 42 on the input surface of the CID error sensor 43. A typical image formed at the sensor input is shown at 63. If the bright lines in the interference pattern 62 coincide with the openings in the spatial reference 41, then an all white picture will be formed at the input of the error sensor 43 and at the output of the error display 44. An all white picture is the ideal case. In the event of a misalignment between an interference pattern that has the same period as the spatial reference, then ideally an all black picture will be formed. In practice, however, errors exist between the interference pattern and the spatial reference, and a Moire pattern is created which has light and dark regions. When the interference pattern 62 is brought into closer correspondence with the spatial reference 41 by the phase error correction means, the number of Moire fringes may be reduced. With better than half wave accuracy the error display may in fact approach an all white condition.

Figure 5A:
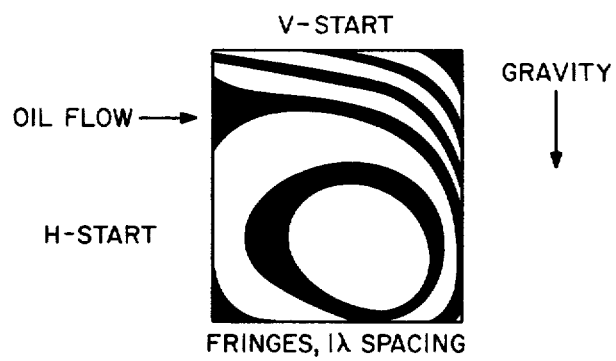
FIG. 5A is a typical Mokire pattern illustrating incorrected phase error attributable to an oil film recording medium in the input transducer.
Figure 5B:
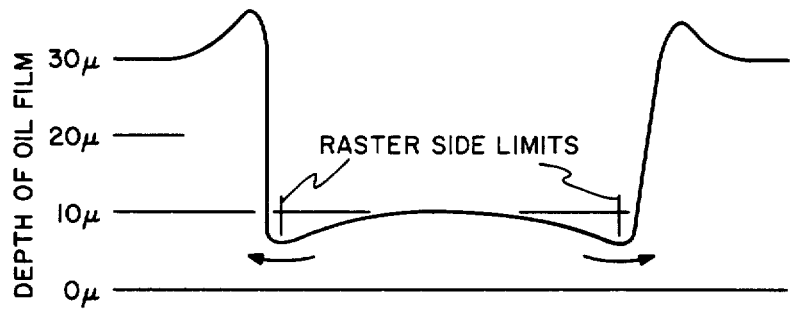
FIG. 5B is a typical cross-section of the oil film forming the recording medium in the input transducer.
Figure 5C:
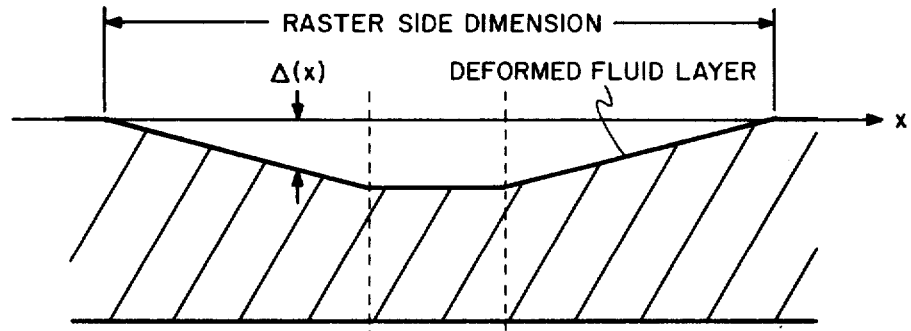
FIG. 5C is a straight line segment idealization of the thickness deformation of the recording medium.
Figure 5D:
FIG. 5D illustrates the frequency shift that must be applied to the carrier to effect phase correction of the deformation illustrated in FIG. 5C.

The source of the phase error in the optical spectrum analyzer of the type illustrated at 63 in FIG. 4 is in part attributable to the conventional optical elements in the system and in part attributable to the optical transducer. The cumulative error of the conventional optical elements is rarely below 1/10th of the optical wave length and can be on the order of $\frac{1}{2}$ to $\frac{1}{4}$ "wave". When the optical transducer is a coherent light valve, in which the raster is formed on the surface of an oil film, the error and flatness of the oil film occasions a much greater error. The oil is typically carried on a slowly rotating disk having a diameter of four to five inches. The raster, normally less than $1'' \times 1''$, uses a small portion of the available oil surface and every measure is taken to insure than when the oil reaches the area used for the raster, it has reached optimum smoothness. The means that are normally employed to smooth the oil include a scraper to establish a uniform depth on the order of 25 to 30 microns and means for feeding oil to the disk in such a way as to maintain the film of constant thickness over time. Granted that these measures are employed, the portion of the oil which reaches the area of the raster is still under the influence of several forces which tend to distort the thickness of the oil within the areas assigned to the raster. These forces may be generally treated as including the effects of rotation of the disk supporting the oil and thus causing the oil to rotate with respect to the raster; the force of gravity which tends to cause the oil to drift from the upper surface of the raster to the lower surface of the raster; and finally and very significantly the pressures exerted upon the oil when a raster is written upon the oil in the form of electrical charges which create both point to point deformation forces as well as grosser deformations with respect to the raster in general. FIG. 5A illustrates a typical Moire fringe produced by the foregoing forces. If one counts fringes from the large white spot one may say that the error from the fringe is about 4-$\frac{1}{2}$ fringes. FIG. 5B is a second of the thickness of the oil in the vicinity of the raster and designed to illustrate the grosser effects of the three forces mentioned above. At the central region of FIG. 5B, the thickness is minimum, being approximately 10 microns or slightly less at the limits of the raster, while the oil film has a thickness of approximately 30 microns outside the raster. At the transition between the raster, where the oil is compressed, and the region surrounding the raster, to which the oil is expelled, the film may reach a height in excess of the average 30 micron thickness maintained elsewhere. The curves at the left edge and the right edge are slightly different implying that the direction of the flow of the oil causes the illustrated differences in contour. It should be pointed out that while the useful portion of the raster is not perfectly flat, the error is normally less than 2 or 3 microns and thus a relatively small number of wave lengths. In addition, since the oil is both viscous and has substantial surface tension, the surface of the oil film is quite smooth. This has the effect of preventing the occurrence of any artifacts.

It has been demonstrated that in an optical input transducer in which electrical signals are written on an oil film in the form of amplitude modulations upon a higher frequency carrier wave, the resultant wave forming a grating along the scan line, and in which solutions are obtained in a spatial frequency plane, that the effect of a linear phase error along the scan line in displacing a spectral spot from its correct postion in the frequency plane may be compensated by increasing or decreasing the frequency of the carrier wave.

The phase compensation system herein disclosed is based upon the foregoing principle and the practical consideration that the thickness of the oil film on which the raster is formed varies continuously, i.e., smoothly over the raster surface. Continuity in film thickness variation leads to continuity (i.e. smoothness) in the phase of the wavefront of the light traversing the oil film. If phase variation of the light wave may be compensated at any given region of the raster by proper carrier frequency selection, then surface continuity suggests that by making these regions sufficiently small, the phase error over the total raster may be reduced to a small value consistent with substantially complete and continuous phase compensation. The present system vindicates these premises.

Figure 5E:
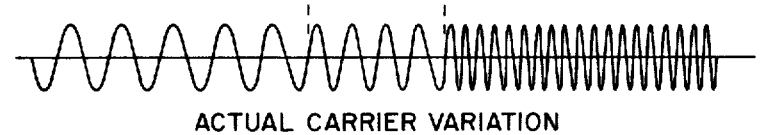
FIG. 5E illustrates how the carrier wave of the variable frequency oscillator is stepped in frequency for phase error correction while the waveform remains continuous and without a discontinuous change in slope.

For example, if 1/30th wave phase accuracy over the raster surface is desired, the raster must be divided into appropriately small subdivisions and the starting phase of each line and the frequency of the carrier wave for each subdivision must be specified. With normally expected variations in thickness of the oil film of the raster, 1/30th wave accuracy may be achieved by dividing the raster into 32×32 or 1024 subdivisions. The phase compenstaion is provided by supplying a carrier-wave, frequency-modulated for phase-compensation at each of the 1024 subdivisions of the raster. To minimize the spurious effects of transients at the transitions between subdividions, the wave form of the carrier wave must be continuous along each line without discontinuous change in slope, while the instantaneous frequency may step discontinuously from value to value at the subdivision boundaries as illustrated in FIG. 5E. In addition, the phase must be synchronized at the beginning of each scan line to provide substantial line to line phase continuity (i.e. in the vertical dimension).

In the practical case considered above, the variable frequency oscillator, as its part in the phase compensation system, must be designed to provide one of $2^{10}$ available frequencies for each raster subdivision, a repertory of potentially 32 output frequencies for each horizontal line of the raster, and potentially 32 repertories as one proceeds along the vertical edge of the raster. Thus, the oscillator frequency is designed to change up to 1,024 times in the course of scanning the raste and a memory must be provided which stores 1,024 such values to the precision desired.

Figure 6:
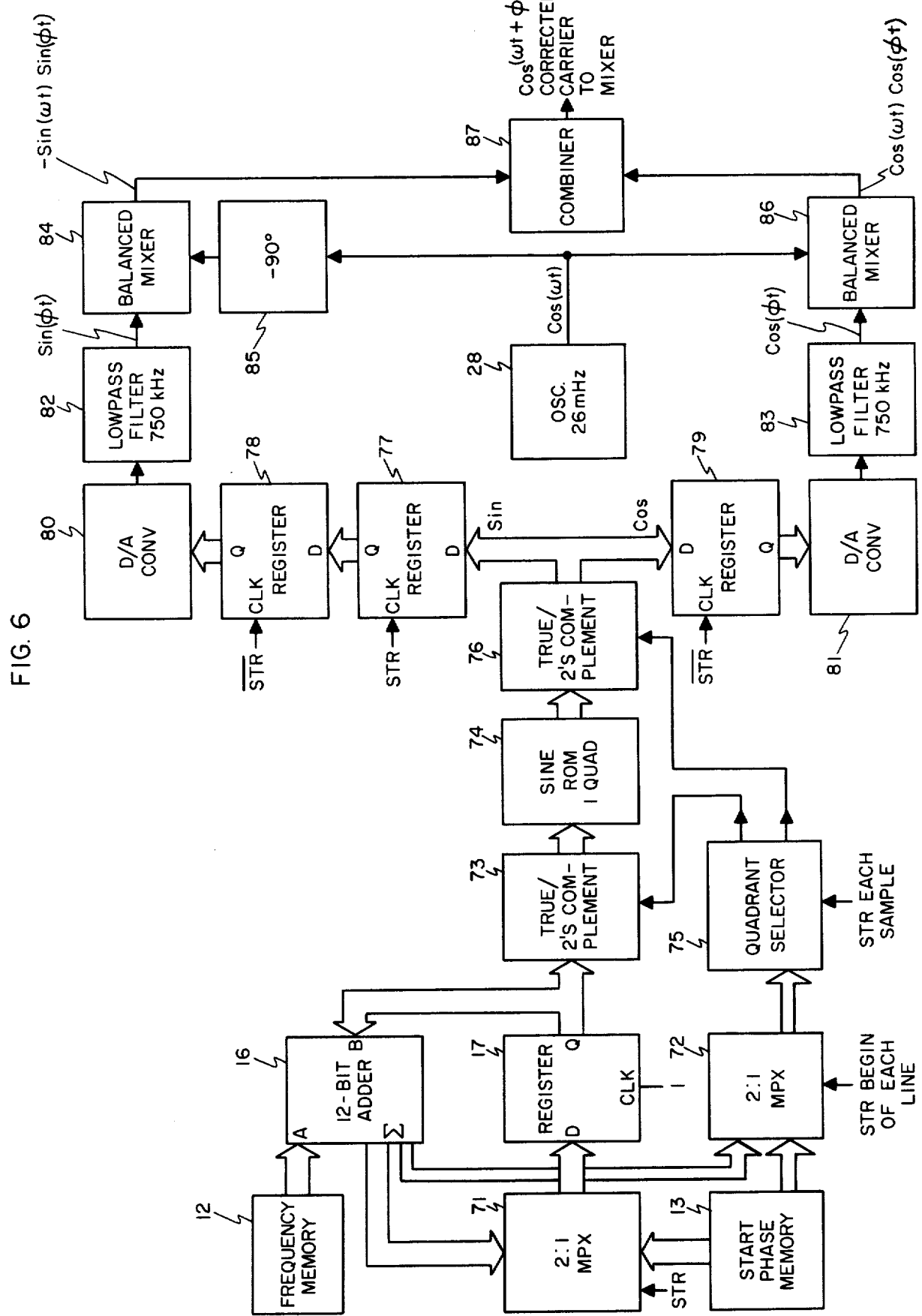
FIG. 6 is a more detailed block diagram of the phase correction network, including the novel variable freqency oscillator and a single side band modulator which develops a corrected carrier for effecting phase correction over the raster of the input transducer.

A practical embodiment of the novel variable frequency oscillator and modulator by which a higher frequency carrier is modulated by the variable frequency oscillator output to provide a phase compensating variable frequency carrier are illustrated in FIG. 6. These correspond to the bolcks 29 and 27 in FIG. 1. The variable frequency oscillator has a property of starting at a prescribed phase at the beginning of each scan line and of maintaining a continuous wave form without a discontinuous change in slope when the frequency is stepped at the 31 transitions required in each scan line. The variable frequency oscillator also has the property of generating a simultaneous sine and cosine output, which as will be explained, provides a convenient method of effecting a frequency modulation of the higher frequency carrier using a conventional single sideband suppressed carrier modulator.

As illustrated in FIG. 6, the variable frequency oscillator comprises the elements 16, 17 and 71 to 83 and the single sideband modulator comprises the elements 84 to 87. FIG. 6 also includes the frequency memory 12 and the start phase memory 13 for the variable frequency oscillator, and the fixed frequency oscillator 28 which is modulated to produce the variable frequency carrier. The variable frequency carrier is the phase error correcting carrier which is amplitude modulated by the input signal in the mixer 24 of FIG. 1.

The variable frequency oscillator comprises a 12 bit adder 16, register 17, a first 2's complementer 73, a sine read only memory (ROM) for one quadrant 74, a second 2's complementer 76, registers 77, 78, 79, D/A converters 80, 81 and low pass filters 82, 83. The multiplex units 71, 72 and the quadrant selector 75 complete the variable frequency oscillator. The frequency memory 12 and the start phase memory 13, supply the stored information required for oscillator frequency and phase control. The output of the variable frequency oscillator consisting of separate sine and cosine waves is supplied to the single side band modulator 27 which consists of a pair of balanced mixers 84, 86, a 90° phase shift network 85 and a combining network 87 at the output of which the variable frequency carrier for phase error correction appears.

The variable frequency oscillator synthesizes simultaneous and continuous sine and cosine waves in a manner which may be summarized as follows. A counter (primarily elements 16, 17 and 71) counting at an adjustable increment from an arbitrary initial value supplies an accumulated count to a read only memory (ROM 72-76) which converts the accumulated count into corresponding sine and cosine values. The digital output of the ROM is converted in a D/A converter (77-83) to an analog output, and the successive analog values are applied to a low pass filter (82,83) to remove discontinuities in the output wave and in its slope and produce the desired continuous sine and cosine waves of variable frequency.

The embodiment illustrated in FIG. 6 performs the functions summarized above in the following manner. The production of a count at an adjustable increment from an arbitrary initial value is achieved by the elements 16, 17 and 71 with the stored information provided by elements 12 and 13. At the beginning of the first line of the raster, a count defining the desired starting phase stored in the start phase memory 13 is coupled through the multiplexer unit 71 to the input of the register 17. At the next clocking interval the initial count is coupled from the output of the register 17 to the sine ROM 74. This count then becomes the basis for the first ROM output. At the same instant, the output of the register 17, which contains the initial count is coupled to the B input of the adder 16, and it is combined with an increment supplied from the frequency memory 12. This increment establishes the initial output frequency of the oscillator. The sum of the initial count and the first increment is then coupled from the output of the adder 16 to a second input of the multiplexer 71 and passed to the input of the register 17. At the second clocking interval, the register output contains the sum of the starting count and a first increment. In successive clocking intervals, additional increments are added, and at any clocking instant a sum appears at the register output which represents the initial count plus an integral number of increments. The process continues in the manner described until the adder 16, which is a 12 bit adder, is filled, at which time the count returns to 0 and commences a recount toward full adder capacity. As will be seen, the number of clocking intervals that it takes for the 12 bit adder to reach full capacity corresponds to one cycle of the sinusoidal or (cosinusoidal) wave forms that are synthesized in the variable frequency oscillator.

The process which has just been outlined, creating approximately 740 cycles of corrected carrier in each line in a practical case where the carrier frequency is 26 megahertz and in which the active time time of a horizontal scan is 28.4 microseconds. Upon returning to the start of the second line, the variable rate counter starts with a new initial count supplied by the start phase memory and the process carried out in the first line is again repeated for approximately 740 cycles as each succeeding line is scanned and the process continues until the raster is complete.

The read only memory 74 and associated elements 72, 73 and 75 through 79 generate one full cycle of sinuosidal and (cosinusoidal) values while the adjustable increment counter is reaching a full count. A full count in the counter is established by the $2^{12}$ bit capacity of the adder 16. The sine ROM 74 is a 1 quadrant device having $2^{10}$ bit resolution. Thus, the ROM can respond to only the 10 least significant bits, should more significant bits appear at the register output. Consistently, the 11the and 12th bits, appearing at the adder output, are used for quadrant designation in a quadrant selector 75 associated with the ROM 74. A full count in the adjustable counter (12 bits), during which the sine ROM 74 traverses one quadrant of the sine function four times, corresponds to one complete sine wave. Since the clocking rate is fixed, a smaller increment stored in the frequency memory 12 forces the adjustable counter, incremented once each clocking interval to take a longer period to complete four quadrants of a sine wave and a lower output frequency is generated. If a larger increment is stored in the frequency memory, the count accumulates more rapidly, the counter takes a shorter period to reach capacity and a higher output frequency is generated. The reach capacity and a higher output frequency is generated. The read only memory provides successive sinusoidal and cosinusoidal values corresponding to each accumulated count produced by the adjustable increment counter.

The read only memory functions in the following manner. As the initial starting value and the initial counts are successively accumulated in the register 17, they are coupled to the 2's complementer 73 whose sine is under the control of the quadrant selector 75. During the initial 10 bits of the count, the control causes the 2's complementer 73 to produce uncomplemented (unnegated) sine values. The uncomplemented output of the 2's complementer (73) is coupled to the sine ROM 74 which contains a look-up table for one quadrant of the sine function at intervals of n/2048 radians. On the succeeding counts, the sine ROM 74 produces a succession of corresponding first quardant sine values. The output of the sine ROM 74 is coupled to a second 2's complementer 76, also under the control of the quadrant selector 75. During the first 10 bits the control causes the output of the sine ROM to remain uncomplemented.

When the count in the adder 16 exceeds 10 bits, the 11th bit, which cannot be used to address the ROM 74 for the first time assumes a value of 1. When the 11th (or 12th) bit appears, it is coupled through the multiplexer 72 to the quadrant selector 75. The quardant selector responds to the presence of a 1 in the 11th bit to cause the 2's complementer 73 at the input side of the sine ROM to complement the next 10 low order bits for the duration of the next quadrant. At the boudnary between first and second quadrant, the first 10 low order bits, would revert to 0's and recommence the upward count in the ROM if the input were uncomplemented. However, the input is complemented and the counting commences from an all 1's state, which now decrements toward 0 with each increment. The sine ROM thus produces a second succession of sine values corresponding to a second quadrant sine function.

At the beginning of the third quadrant, the presence of the first 1 in the 12th bit position appears at the output of the adder 16, and the 11th bit reverts to 0. In the third quadrant, the quadrant selector responding to a 1 in the 12th bit position and a 0 in the 11th bit position causes the 2's complementer 73 to revert to its uncomplementing mode and the sine ROM 74 produces successive counts commencing at all 0's and incrementing to all 1's in the same manner as in the first quadrant. The output of the ROM is negated however by the following 2's complementer 76 under quadrant selector control. In the third quadrant, the count starts from all 0's and increments toward all 1's, but does so in negative values.

The fourth quadrant occurs at the point in the count where both 11th and 12th bits are 1's. When this point occurs, the quadrant selector causes both complementers 73 and 76 to be in the complementing mode. In the fourth quadrant, the count commences at all 1's in negative values and decrements toward all 0's as is required for the fourth quadrant of a sinusoidal function.

While the foregoing apparatus produces a succession of counts corresponding to four quadrants of a sine function, it also produces a succession of counts corresponding to four quadrants of a sine function, it also produces a succession of counts corresponding to four quadrants of a cosine function. The sine function just described, appears on halves of the clocking interval in alternation with the cosine function so that in the eventual synthesis of continuous sine and cosine functions, the two function will appear to be simultaneous values of the same angular argument.

The mechanism for generating simultaneous sines and cosines utilizes the strobe pulse of half the duration of the clocking interval. The strobing pulse, which is coupled uncomplemented to the quadrant selector 75 and the register 77 (at the output of the 2's complementer 76) provides the mechanism for transferring the sine values from the ROM to the register 77 and not to the register 79. Conversely, when the strobe assumes a low value the quadrant selector is placed in the cosine generation mode, and the output of the ROM is transferred to the register 79 to which the complemented strobing connection is applied and not to the clocking register 77.

The synthesis of counts occurring in the cosinusoidal order is generally similar to that of the counts in the sinusoidal order. In the first quadrant of the cosine counts, the quadrant selector causes the 2's complementer 73 to complement the first 10 low order bits and the second 2's complementer 76 to permit the ROM output to remain uncomplemented. Thus, the count commences at all 1's and decrements to 0 as the first quadrant of the cosine function requires. In the second quadrant, the quadrant selector causes the first 2's complementer to be in the non-complemented state, while the second 2's complementer 76 negates the ROM output. This produces a negative count incrementing from all 0's to all 1's. In the third quadrant both 2's complementers are set to produce complements. In the third quadrant the output of the 2's complementer 76, decrements from all 1's to all 0's in negative values. In the fourth quadrant neither complementer is in the complementing mode. In the fourth quadrant, the output of the 2's complementer 76 commences at all 0's and increments to all 1's (in positive values).

Summarizing, the quadrant selector produces the following controls to the 2's complementers 73 and 76 under the joint influence of the strobing pulse and the two highest order bits.

| | Sine (strobe = 0) | | | |
|---|---|---|---|---|
| | Quadrant Selector Inputs | | Quadrant Selector Outputs | |
| Quadrant | 12th bit | 11th bit | $\bar{2}(76)$ | $\bar{2}(73)$ |
| 1 | 0 | 0 | 0 | 0 |
| 2 | 0 | 1 | 0 | 1 |
| 3 | 1 | 0 | 1 | 0 |
| 4 | 1 | 1 | 1 | 1 |
| | Cosine (strobe = 1) | | | |
| | Quadrant Selector Inputs | | Quadrant Selector Outputs | |
| Quadrant | 12th bit | 11th bit | $\bar{2}(76)$ | $\bar{2}(73)$ |
| 1 | 0 | 0 | 0 | 1 |
| 2 | 0 | 1 | 1 | 0 |
| 3 | 1 | 0 | 1 | 1 |
| 4 | 1 | 1 | 0 | 0 |

While applicants have detailed a method of using a one quadrant sine ROM of 10 bit resoltuion to generate four quadrants of sine and cosine values, there are a number of alternatives. For example, one may use a single sine ROM storing four quadrants of sine values togehter with a cosine ROM also storing four quadrants of cosine values. Another alternative is to have a single four quadrant ROM which is multiplexed to produce both sine and cosine values.

The successive counts appearing at the output of the 2's complementer 76 are brought into precise time synchronism and converted to continuous functions by the remaining elements 77 through 83. Assuming that a succession of sine counts is coupled during the first strobing portion of each clocking interval to the register 77 and that a succession of cosine values is coupled during the second strobing portion of each clocking interval to the register 78, the sine and cosine counts appear at the outputs of registers 77 and 79 mutually displaced by the duration of the strobing interval or half the clocking interval. To bring the two counts into coincidence, a second register 78 is provided having a delay equal to the strobing period and coupled to the output of the register 77. The two successions of digital numbers corresponding to sines and cosines now appear in temporal coincidence at the output of the registers 78 and 79. These counts are converted into a succession of analog quantitites by the D/A converters 80 and 81. The low pass filters at the outputs of the D/A converters smooth these successions of discrete values into continuous smooth curves. The low pass filters 82, 83 are adjusted to suppress harmonics above the cutoff frequency and produce a smooth rendition of the sine and cosine curves without a discontinuous change in value or in slope.

The sine wave modulation which has been reconstructed from successive counts generates a smooth curve even through the frequency steps discontinuously at the raster subdivisions. Since the last count in the prior raster subdivision becomes the point from which the next increment starts for the new subdivision, the counting approach always represents an advance along the waveform and any sudden changes (discontinuities) at the subdivision boundaries are prevented. So long as the sampling rate is fast enough, and the low pass filtering adequate to suppress harmonics, the synthesized waveform will be continuous. In the practical case herein described, continuity is assured by making the counting rate four times higher than the expected maximum modulator frequency.

In addition to achieving continuity (i.e. no gaps or vertical jumps) in the waveform, the change in the slope of the transitions is also continuous between raster subdivisions. This is insured when the low pass filter has a low enough cutoff frequency. Assumining thirty-one transitions per line and an active time per line of 28.4 microseconds, the transitions occur at a 1.09 megahertz rate. The 750 kilohertz cutoff frequency of the low pass filters 82, 83 allows the filters to act as integrators, smooothing the slope of the waveform at these transitions and preventing any sudden changes in slope.

The simultaneous sine and cosine waves synthesized by the above means are used to modulate the output of the fixed frequency oscillator 28. The frequency modulator includes the balanced mixers 84 and 86, a phase shift network 85, and the combining network 87. The oscillator output is supplied to the balanced mixer 84 phase shifted by 90°, and to the balanced mixer 86 without phase shift. The balanced mixers 84 and 86 produce upper sidebands which are in phase and lower side bands mutually phase shifted 180° (or vice versa), with a strongly suppressed carrier. The outputs of the balanced mixers 84 and 86 are then coupled in the combining network 87, a simple addition matrix. In the combining network, the mutual phase shift produces cancellation for suppression of the upper (lower) side band and reinformcement for production of the lower (upper)

side band. The single side band which is produced has a frequency which represents the sum (or difference) of the frequency of the fixed oscillator 28 and the variable frequency oscillator, and thus represents a frequency modulation of the original carrier.

The variable frequency oscillator is capable of changing frequency 1,024 times in the course of scanning a raster. The output frequency is a function of the count stored in the frequency memory. Assuming the 2 MHz clocking rate, a count of 10 stored in the memory produces an output frequency of 4.88 KHz and a count of 100 produces a frequency of 48.83 KHz. The low pass filters 82,82 generally suppress output frequencies in excess of 500 KHz. In producing 1,024 discrete frequencies per raster, the frequency memory 12 is accessed by means which are sychronized with the horizontal scanning, vertical scanning and the clock all of which function with the input optical transducer 11 in the conventional manner.

The apparatus for determining the required counts and storing them in the frequency and start phase memories will now be described. The correction process requires that correction values be known and be supplied to the frequency and start phase memories. In practice, a convenient way to obtain such values is by means of the apparatus illustrated in FIG. 2 and FIG. 3. An observer viewing the error display 44 can see the Moire fringes indicating a need for further correction. If a 32 × 32 grid is superimposed upon the error display, an observer can determine which raster area is associated with a given phase error in the laser beam. If a relatively large number of Moire fringes exist, then it is probable that the oil film in the input optical transducer has a large slope and needs a larger correction.

Manual correction of the input optical transducer requires the use of the terminal 15 which permits the observer to introduce phase correcting changes to the subdivisions in a partially manual and partially automatic sequence. In practice, the center of the array is ordinarily the flatest. Hence, manual correction involves expanding the white area of the largest central white fringe toward the starting edge of the horizontal sweep. This is done by changing the frequency of the subdivision on which the nearest dark fringe to the left (using FIG. 5A orientations) falls. If the correction is proper, the white region grows to the left, embracing that subdivision and the dark fringe is pushed toward the left edge of the raster. The process is repeated as necessary until no fringes exist between the large white area and the left or horizontal starting edge of the raster. At this point the operator can now adjust the phase of the subdivisions above and below the enlarged white area so as to enlarge the shite fringe even more at the expense of the surrounding dark fringe. The process is continued in a methodical fashion until essentially all of the left edge is in the same white fringe and the dark fringes are pushed to top and bottom and right side of the raster. Next, the white fringe is pushed to the right side of the raster. In general, frequency adjustment is used during the initial part of the crrection process; start phase adjustment is used along the left edge of the raster; and frequency adjustment is used to push the fringes to the right edge of the raster. Because there are interactions, the adjustment process is iterative. Thus, one may find that fresh fringes appear during the phase adjusting process which requires readjusting the frequency in other raster subdivisions. Also, resetting the frequencies may require resetting the initial phase. The process treats the largest central area as the reference area for all corrections. Due to the nature of the increasing curvature at the margins of the raster, the corrective process is least accurate at these margins. While the present apparatus has a design limitation of 1/30 wave accuracy, practical limitations lead to larger accuracies still of a fractional wave.

The corrective process outlined above is generally suitable for relatively long periods of operation but may be reinstituted when the error display indicates the need for recorrection. In practice, fractional wave accuracy will be maintained for 4 to 8 hour periods. Since the raster error is generally repetitive with very minor variation, a subsequent correction is generally simpler and requires fewer operator iterations than the initial one.

The arrangement herein described and more particularly shown in FIG. 6 is designed for an initial phase error of no more than 8 wavelengths of light at a laser wavelength of 0.6328 microns. The practical arrangement employs largely "TTL" (Transistor Transistor Logic) of the 7400 series. Type or catalog numbers of suitable parts corresponding to elements illustrated in FIG. 6 are as follows:

| | |
|---|---|
| Memories 12, 13 | 2102-2 |
| 12 Bit Adder 16 | 74283 |
| Registers 17, 77, 78, 79 | 74175 |
| Multiplexers 71, 72 | 74157 |
| Two's Complementers 73, 76 | 74H87 and 74283 |
| Sin ROM 74 | MMI6086 |
| Quadrant Selector 75 | 9304 |
| D/A Converters 80, 81 | DAC-HI 12B (DATEL) |
| Low Pass Filters 82, 83 | J63 B TT Electronics |
| Balanced Mixers 84, 86 | ANZAC MHF-3 |
| Phase Shifter 85 | (Passive Network) |
| Oscillator 28 | Countdown from 52MHz Vectron Clock Oscillator |
| Combiner 87 | ANZAC DS-113 |

The variable frequency oscillator output, which is generated by means herein described is of adequate smoothness to avoid the creation of any artifacts in the displays of its own, as for instance, frequency terms at the rate at which raster subdivisions occur in horizontal scanning. This property simplifies interpretation of the phase error in the phase correction process. During normal operation of the optical spectrum analyzer, the same property is essential, since it is desirable that the principal output of the spectrum analyzer have a minimum of extraneous signals.

The variable frequency oscillator herein described has performance characteristics not achieved by other variable frequency oscillators. For instance, it possesses an ability to step rapidly from one frequency to another, to step with continuity in the wave form and in its slope, to start an oscillatory wave at a predetermined phase, to be variable over a wide range of frequencies and throughout the range maintain a high degree of frequency stability. In addition, the subject variable frequency oscillator is readily made coherent with other portions of a raster scanned system, as for instance, the horizontal and vertical synchronizing pulses as well as the fixed high frequency (26 MHz) carrier modulated by an input signal. To underscore the rapidity of the frequency stepping ability, the steps can occur at microsecond intervals. The accuracy of phase control is on the order of $10^{-3}$ radians. The underlying frequency stability of the variable frequency wave is substantially equal to that of the fixed frequency oscillator (26 MHz) from which the 2 MHz clock pulse may be derived. Thus, with an accurate counting rate, and digitally exact incremental counting values, the frequency variation is of the same order of stability as that of the high frequency crystal-controlled oscillator. By contrast, a keyed oscillator lacks uncertainty as to the starting phase and rarely may a stable oscillator be "pulled" over the large frequency ranges herein achieved. A frequency synthesizer which utilizes a phase control loop lacks the agility required, normally requiring a time period reciprocal to the frequency accuracy required - for instance, 1 millisecond is required to stabilize to within 1 KHz.

What is claimed as new and desired to be secured by Letters Patent of the United States is:

1. A variable frequency oscillator for generating an output waveform which is continuous and without discontinuous change in slope as the frequency is stepped through successive discontinuous values, comprising:
   (a) a clocked digital adder having a first and a second input and an output,
   (b) first memory means for applying an input quantity to said first adder for recurrent addition at the clocking interval, said input quantitiy being proportional to the desired instantaneous output frequency f(o) and denoting an instantaneous phase angle increment, $\Delta\theta$,
   (c) a clock controlled digital register transferring input to output at each clocking interval, said clocking rate f(c) being at least four times greater than the maximum oscillator ouptut frequency,
   (d) said adder output being coupled to said register input, said register output being coupled to said second adder input to complete a recirculation loop, the accumulated count in the register output designating a succession of discrete phase angles, $\Delta\theta, 2\Delta\theta, 3\Delta\theta \ldots n\Delta\theta$, incremented at the clocking rate, and counting repetitively to a full count of $2^m$ counts, with any remainder exceeding the $2^{mth}$ count being preserved in the next count to maintain equality in angular incrementation,
   (e) a digital read only memory coupled to the output of said register and producing output values which are a sine (or cosine) function of said discrete input angles in angular increments which are multiples of $2\pi(\frac{1}{2})^m$ radians, $2^m$ input counts corresponding to $2\pi$ radians, and m being selected to be large enough to provide the desired frequency resoltuion,
   (f) a first digital to analog converter coupled to the output of said read only memory for converting said discrete digital values into discrete analog sine (or cosine) values, and
   (g) a low pass filter coupled to the output of said first digital to analog converter having a high frequency cut off adjusted to synthesize a sustained waveform from said discrete analog values at an output frequency f(o):

$$f_{(o)} = \frac{\Delta\theta}{2\pi} f_{(c)}$$

where $\Delta\theta$ is the phase angle increment measured in radians and
f(c) is the clocking rate,
said sustained output waveform assuming successive sine or cosine values.

2. A variable frequency oscillator as set forth in claim 1 for generating an output waveform which is continuous as the frequency is stepped through successive discontinuous values, and which may be started at an arbitrary phase angle $\theta_e$, said oscillator further comprising:
   second memory means coupled into said recirculating loop for introducing a number corresponding to the desired starting phase angle $\theta_e$ at the beginning of the count, said starting phase angle being retained for the remainder of the same and successive full counts.

3. A variable frequency oscillator as set forth in claim 2 wherein said starting phase angle $\theta_e$ is coupled to the input of a said register, the starting angle being timed for admission to the input of said read only memory prior to said first phase angle increment and in time for combination with the first phase angle increment $\Delta\theta$ in said adder, whereby the quantity at the input to said read only memory assumes the following succession of discrete values:

$$\theta_e, \Delta\theta + \theta_e, 2\Delta\theta + \theta_e \ldots n\Delta\theta + \theta_e.$$

4. A variable frequency oscillator as set forth in claim 1 adapted for correction of phase error in a raster scanned input optical transducer, said raster being partitioned into a plurality of regular rectangular subdivisions each associated with a predetermined correction frequency stored in said first memory means, and
   means synchronized with horizontal and vertical scanning of said optical input transducer and coupled to said first memory means and to said register for generating an output waveform having successive frequencies at values corresponding to those stored in said first memory means for each subdivision which a scan line crosses, said waveform maintaining continuity until the scan line is complete, and repeating the process through successive scan lines until scanning of the raster is complete.

5. A variable frequency oscillator as set forth in claim 3 adapted for correction of the phase error in a raster scanned input optical transducer, said raster being partitioned into a plurality of regular rectangular subdivisions each associated with a predetermined correction frequency stored in said first memory means, each of the initial subdivisions at the edge of the raster where scanning starts, being associated with a predetermined starting phase angle for said output waveform, the starting phase angle values being stored in said second memory means, and
   means synchronized with horizontal and vertical scanning of said optical input transducer and coupled to said first and second memory means and to said register for initiating said output waveform at the start of each scan line at a phase corresponding to that stored in said second memory means for the initial subdivision in which the scan line starts and at frequencies corresponding to those stored in said first memory means for each subdivision said scan line corsses, said waveform maintaining continuity until a scan line is complete, and repeating the process through successive scan lines until scanning of the raster is complete.

6. A variable frequency oscillator as set forth in claim 5 adapted for correction of the phase error in a raster scanned input optical transducer, the input signal of which is supplied as an amplitude modulation of a carrier whose frequency is altered over the raster to effect phase correction,
 (a) said read only memory producing discrete values which are sine and cosine functions of each register output,
 (b) means coupling the one function to said first digital to analog converter,
 (c) a second digital to analog converter to which said other function is coupled,
 (d) a second low pass filter coupled to the output of said second digital to analog converter,
 (e) a fixed frequency oscillator,
 (f) a 90 degree phase shift network coupled to said fixed frequency osicllator,
 (g) a first mixer balanced for carrier suppression coupled to one filter output and to said oscillator for modulating said fixed frequency oscillator at reference phase to produce a first pair of sidebands about said fixed frequency,
 (h) a second mixer balanced for carrier suppression coupled to said other filter output and to the output of said phase shift network for modulating said fixed frequency oscillator output at quadrature phase to produce a second pair of sidebands about said fixed frequency, and
 (i) an additive network for combining said mixer outputs for selection of the sidebands from said modulator output which are in phase and suppression of the sidebands which are out of phase to produce a single, variable frequency output for use as said phase correcting carrier.

7. A variable frequency oscillator as set forth in claim 6 wherein:
 (a) said read only memory produces discrete output values which are successive sine and cosine functions of each register output, one function appearing at the first half and the other function appearing at the second half of each clocking period, and further comprises,
 (b) delay means coupled to read only memory for delaying the earlier function for half a clocking period to bring the sine and cosine functions into temporal coincidence, said delay means output being coupled to said first digital to analog converter.

8. A phase corrected, raster scanned light modulator in which information modulated on a carrier is used to form a grating whose spatial frequency along the scanning line varies in accordance with the signal modulation frequency, and whose spatial frequency from line to line is constant, said light modulator being subject to phase errors which vary smoothly over the raster and which permit partitioning said raster into a plurality of rectangular subdivisions each associated with a predetermined phase error, comprising:
 (a) a programmable variable frequency oscillator for generating said carrier, said oscillator having an output waveform which is continuous and without discontinuous change in slope as the frequency is stepped through successive discontinuous values,
 (b) a first memory means for storing a quantity for each raster subdivision corresponding to the carrier frequency required for phase correction of each subdivision, and
 (c) means synchronized with horizontal and vertical scanning of said optical input transducer and coupled to said first memory means and to said programmable variable frequency oscillator for generating an output waveform having successive instantaneous frequencies at values corresponding to those stored in said first memory means for each subdivision as a scan line crosses it, said waveform maintaining continuity until the scan line is complete, and repeating the process through successive scan lines until scanning of the raster is complete.

9. A phase corrected, raster scanned light modulator in which information modulated on a carrier is used to form a grating whose spatial frequency along the scanning line varies in accordance with the signal modulation frequency, and whose spatial frequency from line to line is constant, said light modulator being subject to phase errors which vary smoothly over the raster and which permit partitioning said raster into a plurality of rectangular subdivisions each associated with a predetermined phase error, comprising:
 (a) a programmable variable frequency oscillator for generating said carrier, said oscillator having an output waveform which is continuous and without discontinuous change in slope as the frequency is stepped through successive discontinuous values,
 (b) a first memory means for storing a quantity for each raster subdivision corresponding to the carrier frequency required for phase correction of each subdivision,
 (c) second memory means for storing a number corresponding to a desired starting phase angle $\theta_c$ for the carrier frequency timed with the beginning of each scan line, one starting phase angle $\theta$ being stored for each initial subdivision, aligned along the edge of the raster from which horizontal scanning starts, and
 (d) means synchronized with horizontal and vertical scanning of said optical input transducer and coupled to said first and second memory means and to said programmable variable frequency oscillator for initiating said output waveform at the start of each scan line at a phase corresponding to that stored in said second memory means for the initial subdivision in which the scan line starts and at successive instantaneous frequencies corresponding to those stored in said first memory means for each subdivision as a scan line crosses it, said waveform maintaining continuity until a scan line is complete, and repeating the process through successive scan lines until scanning of the raster is complete.

* * * * *